(12) United States Patent
Bertrand et al.

(10) Patent No.: US 12,057,369 B2
(45) Date of Patent: Aug. 6, 2024

(54) ENHANCED BASE DIE HEAT PATH USING THROUGH-SILICON VIAS

(71) Applicant: Intel Corporation, Santa Clara, CA (US)

(72) Inventors: Weston Bertrand, Tempe, AZ (US); Kyle Arrington, Gilbert, AZ (US); Shankar Devasenathipathy, Tempe, AZ (US); Aaron McCann, Queen Creek, AZ (US); Nicholas Neal, Gilbert, AZ (US); Zhimin Wan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/088,478

(22) Filed: Dec. 23, 2022

(65) Prior Publication Data

US 2023/0128903 A1    Apr. 27, 2023

Related U.S. Application Data

(63) Continuation of application No. 16/794,789, filed on Feb. 19, 2020, now Pat. No. 11,854,935.

(51) Int. Cl.
*H01L 23/433* (2006.01)
*H01L 23/367* (2006.01)
*H01L 25/065* (2023.01)

(52) U.S. Cl.
CPC ........ *H01L 23/433* (2013.01); *H01L 23/3675* (2013.01); *H01L 25/0657* (2013.01)

(58) Field of Classification Search
CPC ............... H01L 23/433; H01L 23/3675; H01L 25/0657; H01L 25/0652; H01L 23/3738
See application file for complete search history.

(56) References Cited

U.S. PATENT DOCUMENTS

| | | |
|---|---|---|
| 2014/0124955 A1 | 5/2014 | Chen |
| 2014/0225248 A1 | 8/2014 | Henderson |
| | (Continued) | |

FOREIGN PATENT DOCUMENTS

| | | |
|---|---|---|
| TW | 201639106 | 11/2016 |
| TW | 201944566 | 11/2019 |
| | (Continued) | |

OTHER PUBLICATIONS

Notice of Allowance and Fees for U.S. Appl. No. 16/794,789 dated Aug. 21, 2023, 8 pgs.

(Continued)

*Primary Examiner* — Thao P Le
(74) *Attorney, Agent, or Firm* — Schwabe, Williamson & Wyatt, P.C.

(57) ABSTRACT

Embodiments of the present disclosure may generally relate to systems, apparatuses, techniques, and/or processes directed to packages that include stacked dies that use thermal conductivity features including thermally conductive through silicon vias (TSVs) filled with thermally conductive material located in passive areas of a first die to route heat from a first die away from a second die that is coupled with the first die. In embodiments, the first die may be referred to as a base die. Embodiments may include thermal blocks in the form of dummy dies that include TSVs at least partially filled with thermal energy conducting material such as copper, solder, or other alloy.

20 Claims, 7 Drawing Sheets

(56) References Cited

U.S. PATENT DOCUMENTS

| | | |
|---|---|---|
| 2017/0294422 A1 | 10/2017 | Solimando |
| 2019/0067157 A1 | 2/2019 | Lin |
| 2019/0318975 A1 | 10/2019 | Shi |
| 2019/0393124 A1 | 12/2019 | Wuu |
| 2020/0013698 A1 | 1/2020 | Yu |
| 2020/0051888 A1 | 2/2020 | Lin |
| 2020/0357721 A1 | 11/2020 | Sankman |
| 2021/0035921 A1* | 2/2021 | Neal ................ H01L 23/5385 |
| 2021/0193549 A1 | 6/2021 | Eid |
| 2021/0249324 A1 | 8/2021 | Wan |
| 2021/0249329 A1 | 8/2021 | Chen |
| 2021/0305162 A1 | 9/2021 | Ganesan |
| 2022/0068750 A1 | 3/2022 | Ong |
| 2022/0093492 A1* | 3/2022 | Elsherbini ............ H01L 23/49 |
| 2022/0301971 A1* | 9/2022 | Lin ...................... H01L 25/18 |
| 2022/0344304 A1* | 10/2022 | Pan ...................... H01L 24/33 |
| 2022/0415866 A1 | 12/2022 | Jaggers |
| 2023/0018343 A1* | 1/2023 | Lin .................. H01L 23/5384 |
| 2023/0067349 A1* | 3/2023 | Lin .................. H01L 21/6835 |

FOREIGN PATENT DOCUMENTS

| | | |
|---|---|---|
| TW | 202004926 | 1/2020 |
| TW | 202006838 | 2/2020 |

OTHER PUBLICATIONS

Office Action from Taiwan Patent Application No. 109141204 dated Oct. 2, 2023, 8 pgs.

Office Action from Taiwan Patent Application No. 109141204 mailed Jan. 10, 2024, 8 pgs.

Office Action from Taiwan Patent Application No. 109141204 mailed May 2, 2024, 7 pgs.

* cited by examiner

ENHANCED BASE DIE HEAT PATH USING THROUGH-SILICON VIAS

CROSS-REFERENCE TO RELATED APPLICATIONS

This application is a continuation of U.S. patent application Ser. No. 16/794,789, filed on Feb. 19, 2020, the entire contents of which is hereby incorporated by reference herein.

FIELD

Embodiments of the present disclosure generally relate to the field of package assemblies, and in particular package assemblies that include stacked dies.

BACKGROUND

Continued reduction in end product size of mobile electronic devices such as smart phones and ultrabooks is a driving force for the development of reduced-size system-in-package components.

DETAILED DESCRIPTION

Figure 1:
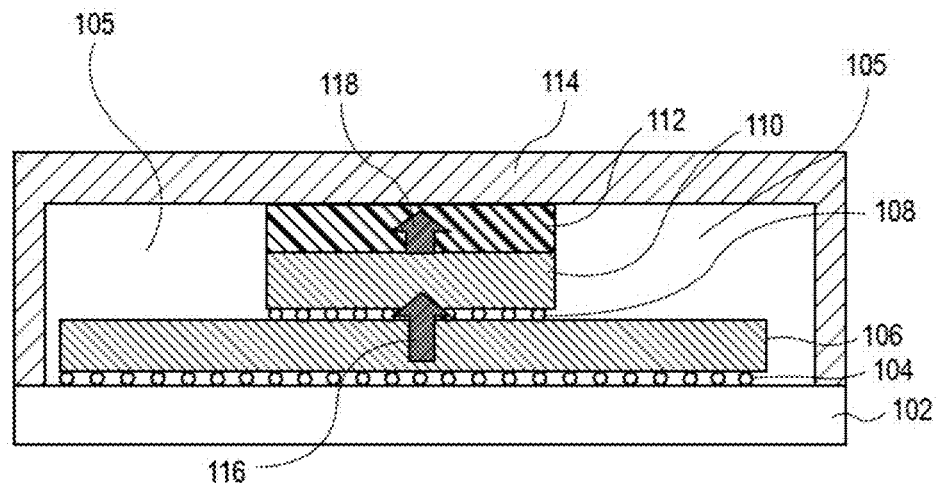
FIG. 1 illustrates a side view of a legacy stacked die package with thermal energy flow from a base die through a top die.

Embodiments of the present disclosure may generally relate to systems, apparatuses, techniques, and/or processes directed to packages with thermally conductive features in the form of TSVs to route thermal energy generated in a base die in the package away from a top die that is thermally coupled to the base die. In embodiments, a base die may be referred to as a first die, and a top die may be referred to as a second die.

Embodiments of the thermal conductivity features may include one or more thermal blocks that may take the form of dummy dies that include TSVs that are at least partially filled with thermally conductive material. These dummy dies may be thermally coupled with a base die or with multiple base dies to route thermal energy, or heat, away from the top die.

Other embodiments of thermal conductivity features include TSVs included within a passive portion of a base die, or multiple base dies, to collect thermal energy from within the base die and to route it to a surface or an edge of the base die. In embodiments, metallic layers or other heat routing structures within the base die may facilitate routing of the thermal energy within the base die to the TSVs within the passive portion of the die. In embodiments, the TSVs may be at least partially filled with thermal energy conductive material with respect to the dummy dies.

In embodiments, a combination of dummy dies and TSVs in passive portions of base dies may be used within a package depending upon the layout and geometry of the various dies used in the package, and the desired thermal energy routing paths within the package. In embodiments, the heat may be routed to an integrated heat spreader (IHS) surrounding the package dies.

In legacy stacked die architectures, die cooling is a significant issue. A base die, instead of having a dedicated thermal interface material to extract thermal energy from the base die during operation, is now generating thermal energy and propagating to the top die, or vice versa depending upon the workload on the stacked dies. As a result, the top die and the bottom die are more thermally and operationally constrained by the increasing thermal energy between them.

A single die may be in thermal contact with a thermal interface material (TIM) and an IHS in order to propagate heat to a thermal solution, for example, a cold plate may be thermally coupled to the IHS. Legacy stacked die architectures propagate heat through TIMs/IHS to achieve cooling, but also pass heat through the one or more top dies that may be stacked on the base die. This leads to significantly diminished thermal performance of the system due to die-to-die heating (which may be referred to as "cross-talk") and by preventing the surfaces of the base die that are not directly thermally connected by a top die from making a good thermal coupling with a TIM or an IHS.

In legacy implementations, an overmold, which may include a polymer-based material, is applied on the volume above the base die not occupied by the top die, and may be in contact with the TIM. In legacy implementations, there may be an epoxy material between the overmold and the TIM. In these implementations, the overmold does not have a good thermal conductivity and may not significantly route thermal energy away from other stacked dies. Warping of package components may also be an issue with the polymer overmold, resulting from a different coefficient of thermal expansion (CTE) than other materials in the package.

In embodiments described herein, one or more TSVs, including densely clustered TSVs, may include materials having a high thermal conductivity as described above. These materials may include copper, solder, silver, gold, tungsten, titanium, tin, or other suitable thermally conductive metal or metallic compound. The materials may also include ceramic, or filled polymeric compounds. These materials provide a lower thermal resistance path for thermal energy to be dissipated from either the base die or the top dies. Dummy dies that include these TSVs may be made of materials that include silicon or other materials known from thermal conductivity.

Embodiments described herein may reduce overall thermal resistance of a package and allow for better cooling routes for base dies. Implementation of the embodiments described herein may allow products using a stacked die architecture, such as a Foveros® architecture, to run at higher power before reaching maximum chip operating temperatures. In addition, embodiments may help reduce the power required to operate the overall system since power required to cool the package would be lower.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIG. 1 illustrates a side view of a legacy stacked die package with thermal energy flow from a base die through a top die. FIG. 1 shows a legacy implementation that includes a base die 106, which may also be referred to as a first die, that is coupled to a substrate 102 through an interconnection layer 104. The interconnection layer 104 may include a ball grid array (BGA) or other suitable interconnection structure. The top die 110, which may also be referred to as a second die, is coupled to the base die using an interconnect layer 108. The interconnect layer 108 is thermally conductive and may include multiple solder connections.

During operation, the base die 106 generates a first thermal energy 116 that flows into the top die 110. During operation, the top die 110, in addition to receiving the first thermal energy 116, may also generate a second thermal energy 118. As a result, the second thermal energy 118, in addition to the first thermal energy 116, may flow through a TIM 112 that is thermally coupled with an IHS 114. As shown, the top die 110 serves as a thermal pathway for thermal energy generated by the base die 106. This may result in the top die 110 being thermally constrained, where die performance and/or quality of the overall package may be negatively impacted.

In embodiments, the IHS 114 may serve to partially or to completely surround the first die 106, second die 110. The IHS 114 may be thermally coupled with a cold plate (not shown) or other cooling device to remove heat from the package. Some legacy implementations include a polymer-based overmold included in empty spaces 105 between the IHS 114 and the substrate 102.

Figure 2A:
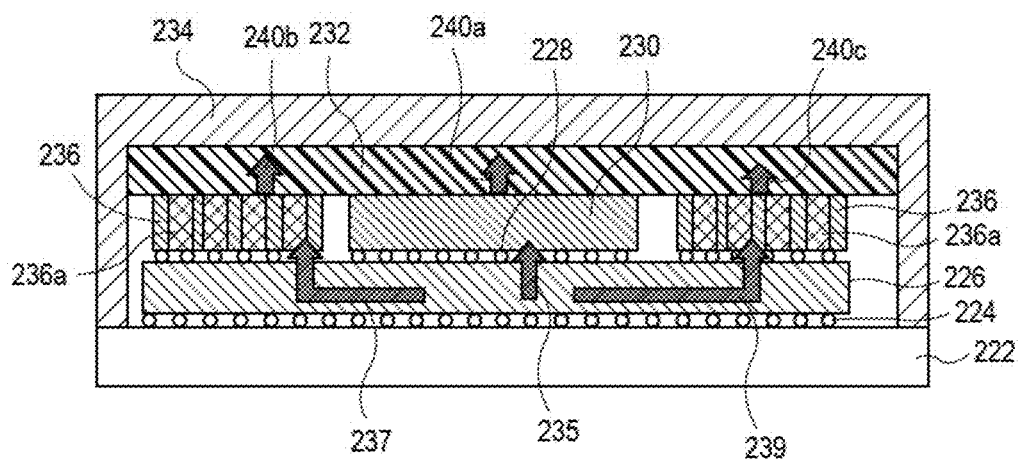
FIGS. 2A and 2B illustrate a side view and a top view, respectively, of a stacked die package that includes a base die coupled with a dummy die to route thermal energy flow away from a top die thermally coupled with the base die, in accordance with embodiments.
Figure 2B:
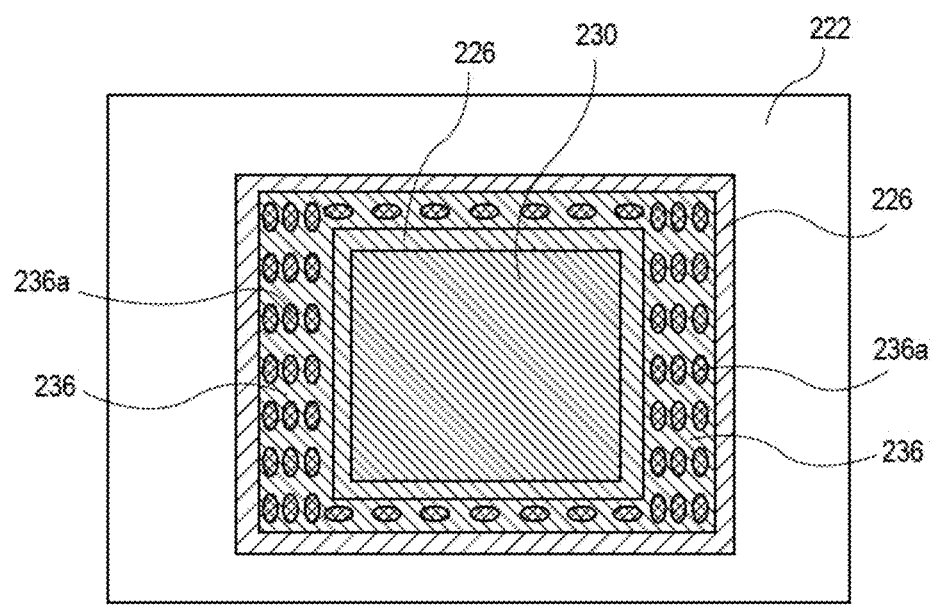

FIGS. 2A and 2B illustrate a side view and a top view, respectively, of a stacked die package that includes a base die coupled with a dummy die to route thermal energy flow away from a top die thermally coupled with the base die, in accordance with embodiments. The FIG. 2A side view includes a base die 226 that is coupled with the substrate 222 using solder balls 224. The base die 226 is also thermally coupled with a stacked top die 230 using interconnect 228. Base die 226, substrate 222, and top die 230 may be similar, respectively, to base die 106 substrate 102, and top die 110 of FIG. 1. Dummy die 236 is directly thermally coupled with the base die 226 to absorb thermal energy 237, 239, respectively from the base die 226 during operation. As shown in the top view of FIG. 2B, the dummy die 236 has a center opening that surrounds the top die 230. Note that the IHS 234 and TIM 232 are not shown in FIG. 2B for clarity.

In embodiments, the dummy die 236 may be made of molding, silicon, polymer, or some other material or combination thereof. The dummy die 236 includes thermally conductive features, for example, but not limited to, TSVs 236a that are at least partially filled with highly thermally conductive material, as described above. As shown, the TSVs 236a may take the form of copper pillars, which may be manufactured using legacy techniques. The TSVs 236a, as shown in FIG. 2B are uniformly distributed to direct thermal energy 237, 239 to the dummy die 236, and to minimize the thermal energy 235 that may flow to the top die 230.

The layout of the TSVs 236a may vary in density or size associated with various regions on the dummy die, as discussed further below. For example, the TSVs 236a, may be more spread out, may be tightly clustered, or irregularly grouped depending on thermal dissipation requirements associated with the base die 226. For example, groupings of TSVs 236a may be selected to correspond to areas of higher generated thermal energy expected on the base die 226 during operation to more efficiently route thermal energy away from those areas and away from the top die 230. In addition, in embodiments, the multiple TSVs 236a through the dummy die 236 may be cylindrical (as shown), oblong shape, rectangular shaped, or some other shape to allow highly thermally conductive material to be added to at least part of the TSV 236a to facilitate thermal energy transfer through the dummy die 236 and away from top die 230.

Also, as discussed further below, there may be multiple dummy dies 236 that may have different dimensions including different heights that may depend upon physical features of the base die 226, or thickness attributes of the TIM layer 232. In embodiments, a TIM layer 232 may be thermally coupled to the dummy die 236 and to the top die 230, to facilitate thermal energy flow 240a, 240b, 240c to the IHS 234, which may be similar to IHS 114 of FIG. 1.

Figure 3A:
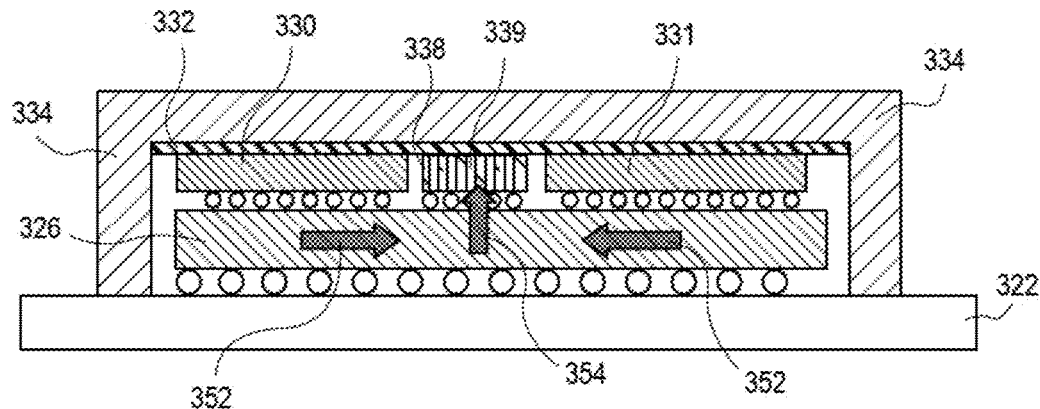
FIGS. 3A and 3B illustrate a side view and a top view of a stacked die package that includes a base die coupled with a dummy die with a plurality of through silicon vias (TSVs) filled with thermally conductive material to route thermal energy flow away from top dies thermally coupled with the base die, in accordance with embodiments.
Figure 3B:
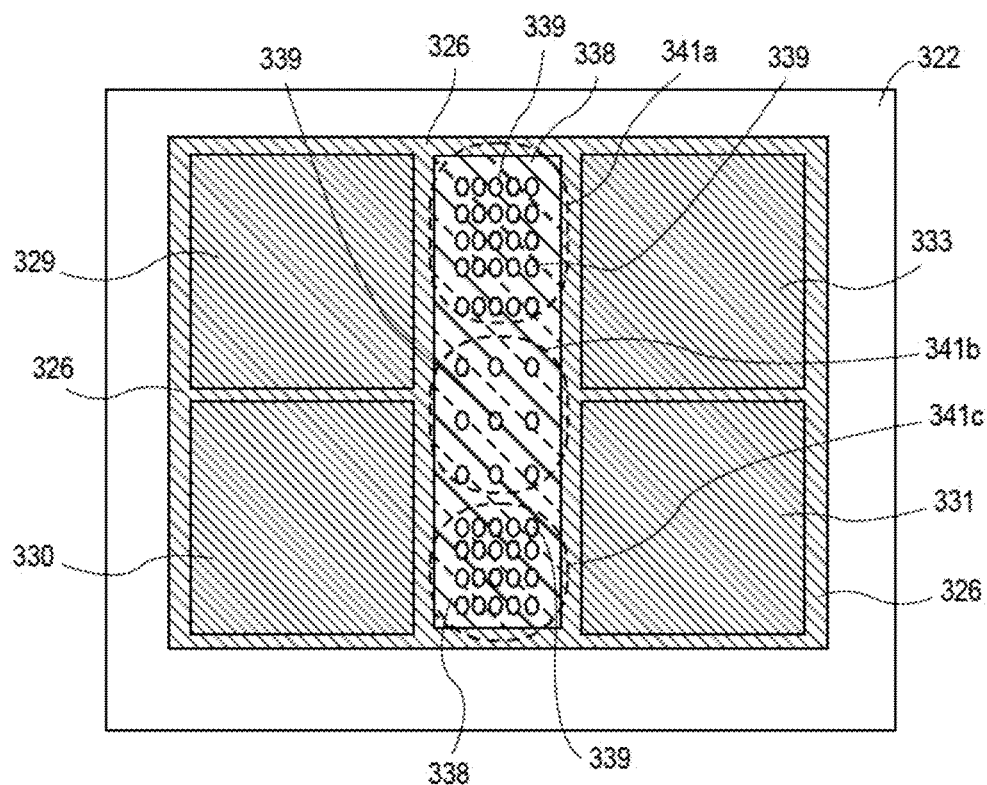

FIGS. 3A and 3B illustrate a side view and a top view of a stacked die package that includes a base die coupled with a dummy die with a plurality of TSVs filled with thermally conductive material to route thermal energy flow away from top dies thermally coupled with the base die, in accordance with embodiments. FIG. 3A shows a side view of a base die 326 that is coupled to a substrate 322, which may be similar, respectively, to base die 226 and substrate 222 of FIG. 2A. Top dies, 330, 331, 329, 333, which may be similar to top die 230 of FIG. 2A, are thermally coupled to a top surface of the base die 326. The top dies 330, 331, 329, and 333 are also thermally coupled with a TIM layer 332, which is similar to TIM layer 232 of FIG. 2A, that is coupled with IHS 334, which is similar to IHS 234 of FIG. 2A.

As is shown with respect to FIG. 3B, each of the top dies 330, 331, 329, 333 are positioned near the outer edges of the base die 326. A dummy die 338 is thermally coupled with the base die 326, and is positioned between a first set of top dies 330, 329 and a second set of top dies 331, 333. In other embodiments, the dummy die 338 could be coupled with the base die 326 in a variety of areas, depending upon the location, arrangement, or geometry of the top dies and a thermal profile of areas of the base die during operation, to extract thermal energy from the base die where a top die is not located. Note that the IHS 334 and TIM 334 are not shown in FIG. 3B for clarity.

The dummy die 338 includes a plurality of TSVs 339 that are at least partially filled with a thermally conductive material, as discussed above. The dummy die 338 may be a silicon die, with the TSVs 339 manufactured using a traditional process. In embodiments, the dummy die 338 may be made from a block of other material, such as silicon, a mold or other compound, that have TSVs 339 or their equivalents positioned within the block. In embodiments, the dummy die 338 may be directly coupled with the base die 326 using a legacy interconnect technology, solder balls, micro bumps, and the like, that allow for high thermal conductivity. In embodiments, the dummy die 338 may be directly coupled using an adhesive designed to withstand a range of thermal activity produced by the base die 326. In other embodiments, the dummy die 338 may be broken into individual dummy dies that are applied to the thermal regions 341a, 341b, 341c.

In embodiments, the TSVs 339 within the dummy die 338 may be clustered using different densities in various regions of the dummy die 338. For example, a tighter clustering of TSVs 339 is used corresponding to locations 341a, 341c in the base die 326 that produce a higher level of thermal energy. Location 341b of the base die 326 corresponding with lower levels of thermal energy will use a less dense TSV 339 clustering. In embodiments, the clustering of TSVs 339 may also be determined based on strength characteristics desired in the dummy die 338 to compensate for warpages during package operation. In this way, the dummy die 338 may serve to both direct thermal energy 352 away from the top dies 330, 331, 329, 333 and direct the thermal energy 354 into the dummy die 338, and to strengthen the package to increase the operational quality of the package.

Figure 4A:
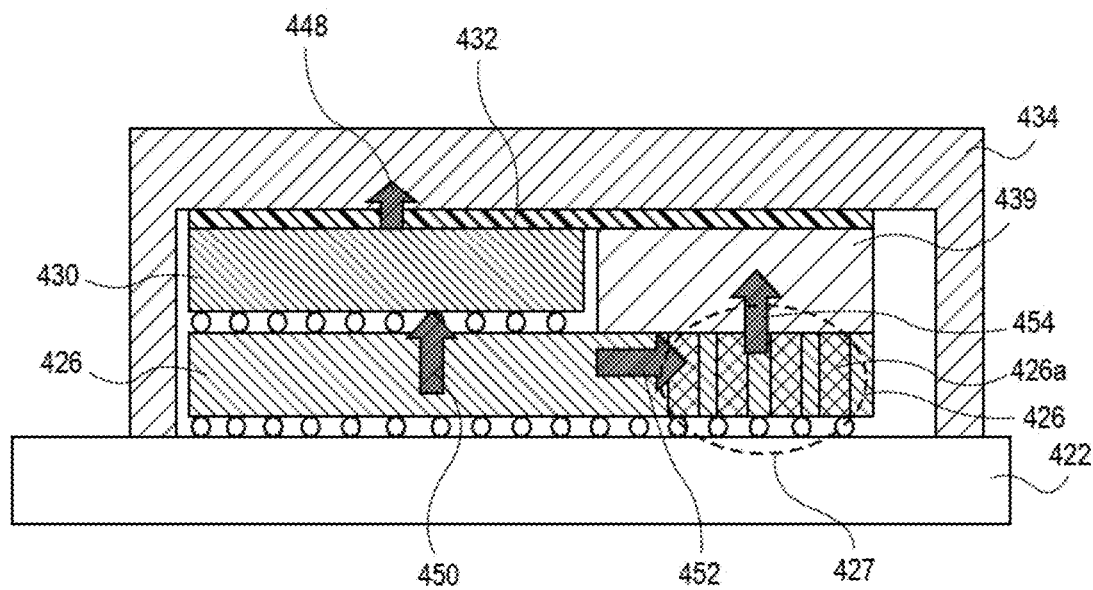
FIGS. 4A and 4B illustrate a side view and a top view, respectively, of a stacked die package that includes a base die that includes thermally conductive features in a passive area of the base die to route thermal energy flow away from a plurality of top dies thermally coupled with the base die, in accordance with embodiments.
Figure 4B:
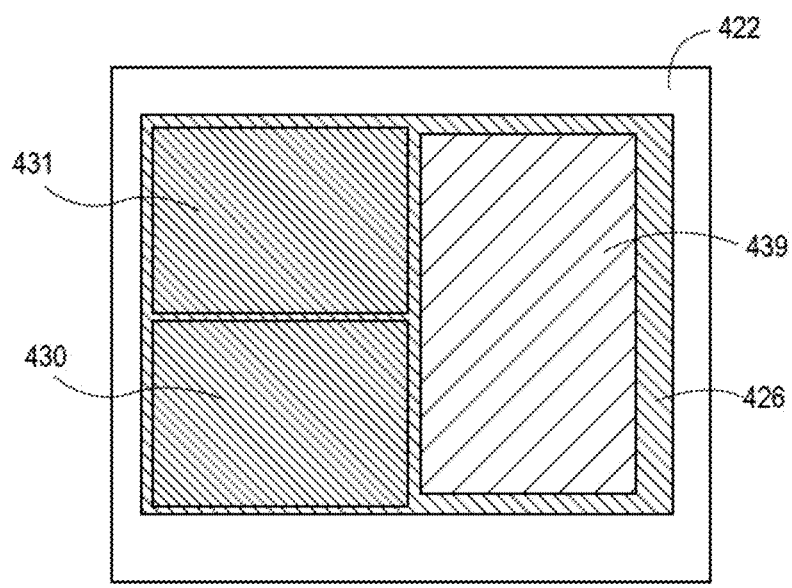

FIGS. 4A and 4B illustrate a side view and a top view, respectively, of a stacked die package that includes a base die that includes thermally conductive features in a passive area of the base die to route thermal energy flow away from a plurality of top dies thermally coupled with the base die, in accordance with embodiments. FIG. 4A shows a side view of a base die 426 that is coupled to substrate 422, which may be similar, respectively to base die 326 and substrate 322 of FIG. 3A. Top dies 430, 431, which may be similar to top die 330 of FIG. 3A, are thermally coupled to a surface of the based die 426. Top dies 430, 431 are thermally coupled with a TIM 432, which in turn is thermally coupled to an IHS 434, which may be similar, respectively, to TIM 332 and IHS 334 of FIG. 3A.

The base die 426 includes TSVs 426a that exist within a passive portion 427 of the base die 426. Passive portion 427 may include a volume within the base die 426 where there are no electrical or other conductive features that electrically affect the operational performance of the base die 426.

In embodiments, there may be multiple TSVs 426a within portion 427, and may be designed, clustered, and/or manufactured in a way similar to the TSVs 339 of FIG. 3B. In embodiments, there may be multiple passive portions 427 within the base die 426, and may be located anywhere within the base die 426. The TSVs 426a may be at least partially filled with thermally conductive material as described above with respect to TSVs 339 of FIG. 3B. Note that the IHS 434 and TIM 432 are not shown in FIG. 4B for clarity.

A thermal block 439 may be coupled with the base die 426 at a region proximate to the TSVs 426a, as well as thermally coupled to the TIM 432. In embodiments, the thermal block 439 may include a thermally conductive mold material that may be used to conduct thermal energy from the base die 426 to the TIM 432. In embodiments, the thermal block 439 may be adjacent to or tangent to the top dies 430, 431, or the thermal block 439 may be separated from the top dies 430, 431 by an air gap, or by some other thermally insulating material (not shown). In embodiments, there may be multiple thermal blocks 439 that are thermally coupled with the base die 426 where TSVs 426a may be located. In other embodiments, a dummy die, such as dummy die 338 of FIG. 3A may be used instead of, or in addition to, one or more thermal blocks 439 to draw the thermal energy from the TSVs 426a.

The TSVs 426a are used to route thermal energy 452, 454 away from thermal generation sources of the base die 426 and into the thermal block 439, to reduce the thermal energy 450 that is sent to the top dies 430, 431. In embodiments, the base die 426 may include thermal features within the die (not shown), such as metal layering, to move thermal energy 452 horizontally from the left portion of the base die 426 to the TSVs 426a. This is to reduce the thermal energy 450 flowing from the base die 426 to the top dies 430, 431, reduce the thermal energy flowing 448 from the top dies 430, 431 to the TIM 432 and IHS 434. Because thermal conductivity, or conduction heat transfer, is a function of material thermal resistance, lateral heat transfer may occur more readily if high thermal conductivity TSVs 426a are present in a passive portion 427 of the base die 426. This is in contrast to a legacy implementation where just the bulk silicon of a passive region 427 is relied on to transfer heat and that has a lower thermal conductivity than the TSVs 426a. In embodiments, the TSVs 426a move thermal energy away from the second die 430 to minimize the thermal energy 450 transferred during operation from the first die 426 to the top dies 430, 431, and subsequently to minimize the thermal energy 448 that is transferred from the second die 430 to the IHS 434.

Figure 5A:
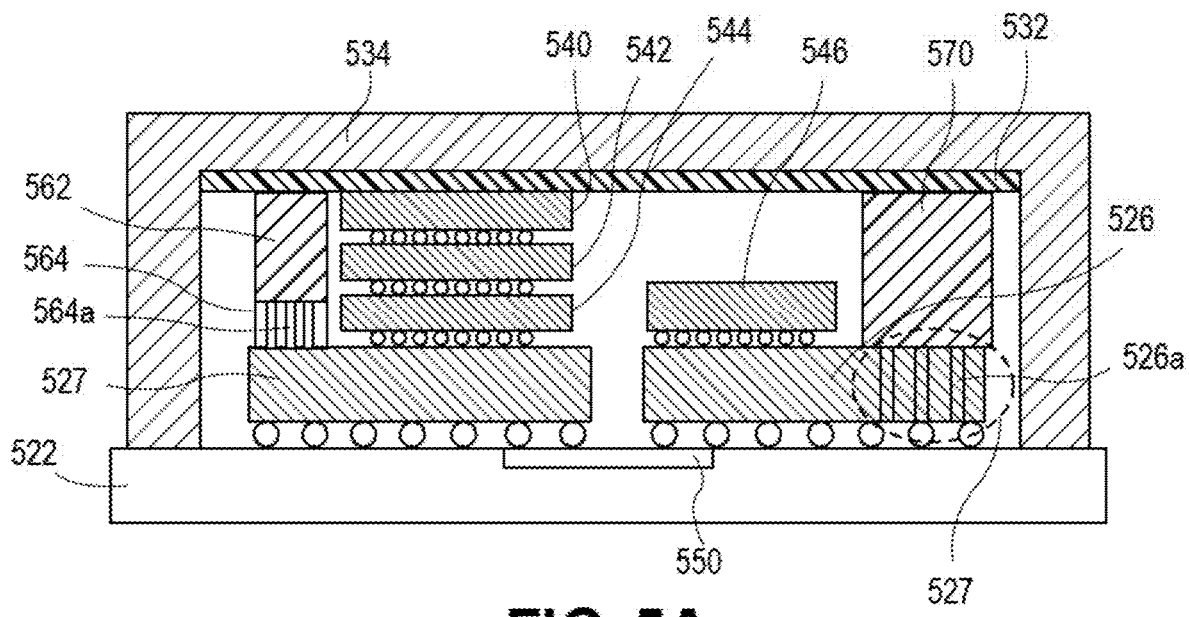
FIGS. 5A and 5B illustrate a side view and a top view, respectively, of a stacked die package that includes a plurality of base dies connected using Embedded Multi-die Interconnect Bridge EMIB technology that are thermally coupled with a plurality of top dies, including high bandwidth memory (HBM) dies, where TSVs in passive areas of some of the base dies, and dummy dies coupled with some of the base dies, route thermal energy flow away from the plurality of top dies, in accordance with embodiments.
Figure 5B:
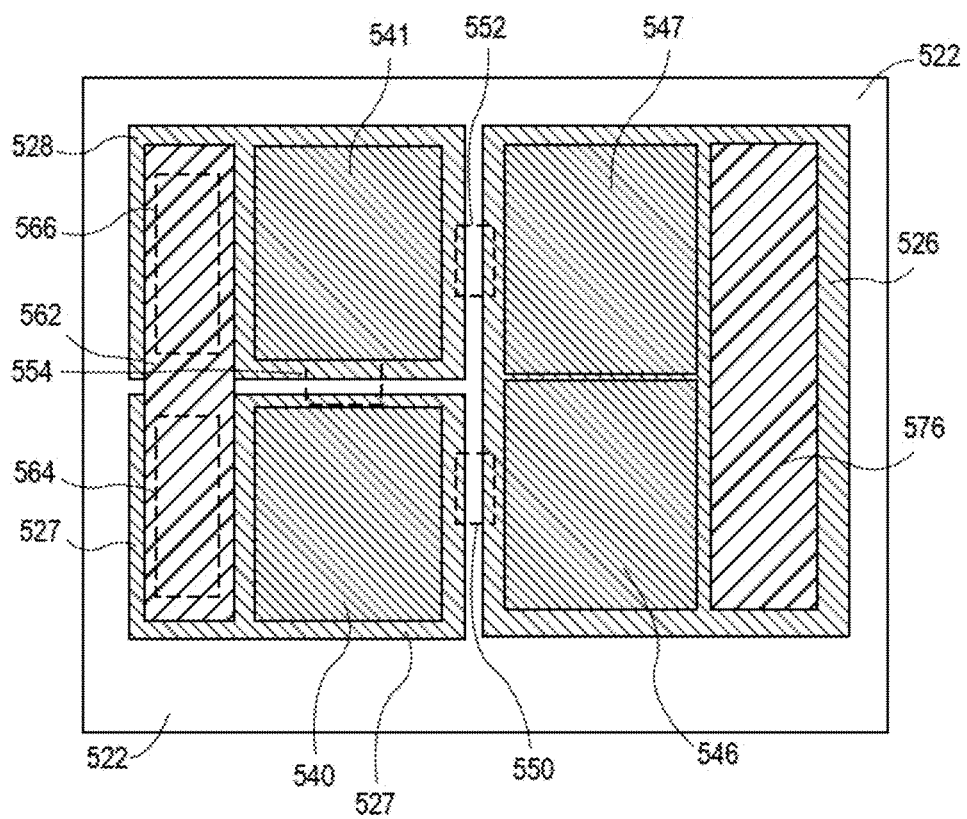

FIGS. 5A and 5B illustrate a side view and a top view, respectively, of a stacked die package that includes a plurality of base dies connected using Embedded Multi-die Interconnect Bridge EMIB technology that are thermally coupled with a plurality of top dies, including high bandwidth memory (HBM) dies, where TSVs in passive areas of some of the base dies, and dummy dies coupled with some of the base dies, route thermal energy flow away from the plurality of top dies, in accordance with embodiments.

FIG. 5A shows a side view of three base dies 526, 527, 528, which may be similar to base die 426 of FIG. 4A, that are coupled with top dies 540, 541, 542, 544, 546, 547, which may be similar to top die 430 of FIG. 4A. The base dies 526, 527, 528 are connected using EMIB connectors 550, 552, 554. Base die 527 is coupled with HBM die 544, with additional HBM dies 540, 542 stacked vertically on HBM die 544. Base die 528 is coupled with a top die 541, and base die 526 is coupled with two dies 546, 547. In this configuration, routing thermal energy generated by base die 527 to flow to the IHS 534 and around the HBM dies 540, 542, 544 will improve HBM performance and overall package quality.

Dummy dies 564, 566 have been coupled, respectively, to surfaces of the base dies 527, 528. The dummy dies 564, 566 may be similar to dummy dies 438 of FIG. 3B. Note that the IHS 534 and TIM 532 are not shown in FIG. 5B for clarity. In embodiments, dummy die 564 includes a plurality of TSVs 564a, which may be similar to TSVs 439 of FIG. 3B. In embodiments, the TSVs 564a are at least partially filled with highly thermally conductive material, such as copper or copper pillars. Each of the dummy dies 564, 566 are thermally coupled with a single thermal block 562 that extends across both base dies 527, 528. In this embodiment, the single thermal block, which may be similar to the thermal block described above, may be used to indirectly thermally coupled the two base dies 527, 528 as it routes heat through the TIM 532 and to the IHS 534. In other embodiments, thermal block 562 may be split into two distinct thermal blocks that are thermally isolated from each other, each serving, respectively, base die 527 and base die 528, and routing the thermal energy from each base die through to the IHS 534.

Base die 526 includes multiple TSVs 526a in the passive region 527 that thermally extract heat from the base die 526 and away from the top dies 546, 547. TSVs 526a may be similar to TSV 426a of FIG. 4A. TSVs 526a are at least partially filled with material that is highly thermally conductive, to route thermal energy into the thermal block 570, for eventual dissipation through the TIM 532 and to the IHS 534.

FIGS. 5A and 5B give an example of the flexibility of heat routing techniques using TSVs in dummy dies and in passive areas of a die. As is shown, combinations of base dies, especially using EMIB technology, may have unique patterns and combinations that constrain positioning of legacy thermal energy removal techniques. During operation, the additional thermal energy removal and rerouting options that are available with the TSV implementations in dummy dies and in passive areas of dies as described herein provide increased design flexibility in targeting particular hotspots within a base die and routing the generated heat through to an IHS 534.

It should also be appreciated that the terms "base die" and "top die" have been used throughout to identify, respectively, a thermal energy generating die and another die that at least a portion of the generated thermal energy should be routed away from. In embodiments, the "base die" may be referred to as a "first die", at the "top die" may be referred to as a "second die." In these embodiments, the first die and the second die may have any spatial relationship, including above or below, or side to side. In embodiments, the package that includes the first die and the second die may be a smaller component within a larger system, which may or may not include an IHS, such as IHS 234 of FIG. 2A.

Figure 6:
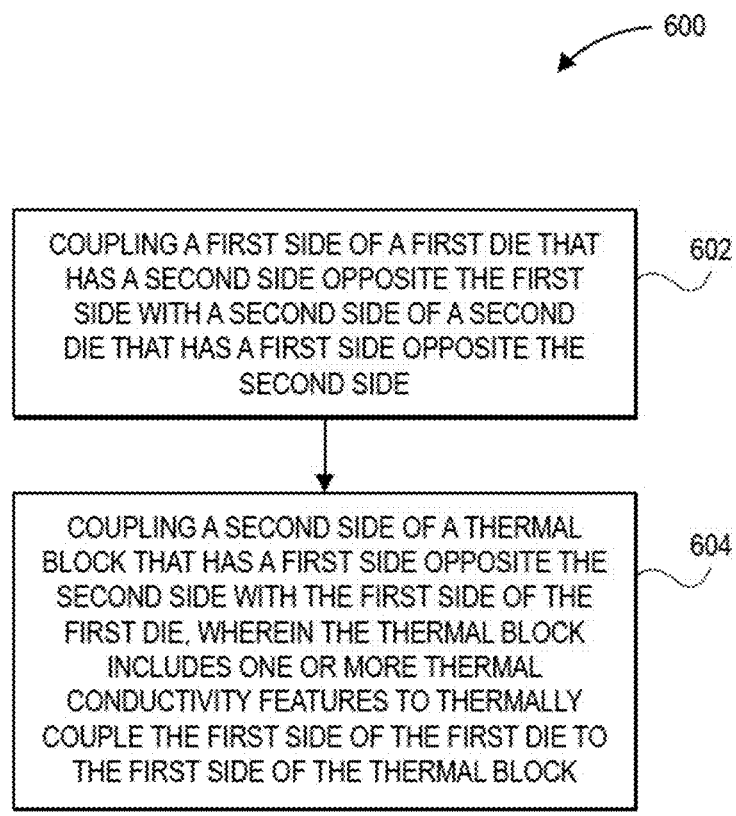
FIG. 6 illustrates an example of a process to apply a thermal block that includes thermal conductivity features to a first die to route heat away from a second die that is thermally coupled with the first die, in accordance with embodiments.

FIG. 6 illustrates an example of a process to apply a thermal block that includes thermal conductivity features to a first die to route heat away from a second die that is thermally coupled with the first die, in accordance with embodiments. Process 600 may be performed by one or more elements, techniques, or systems referred to in FIGS. 2A-5B.

At block 602, the process may include coupling a first side of a first die that has a second side opposite the first side with a second side of a second die that has a first side opposite the second side. In embodiments, the first die may be similar to the base die 226 of FIGS. 2A-2B, base die 326 of FIGS. 3A-3B, base die 426 of FIGS. 4A-4B, or base dies 526, 527, 528 of FIGS. 5A-5B. The second die may be similar to the top die 230 of FIGS. 2A-2B, top dies 329, 330, 331, 333 of FIGS. 3A-3B, top dies 430, 431 of FIGS. 4A-4B, or top dies 540, 542, 544, 546, 547 of FIGS. 5A-5B.

In embodiments, the coupling may include thermal coupling, which may be accomplished through an interconnect process that may include, but is not limited to, solder joints or ball grid arrays (BGA). In embodiments the first die in the second die may be stacked in a Foveros package architecture.

At block 604, the process may include coupling a second side of a thermal block that has a first side opposite the second side with the first side of the first die, wherein the thermal block includes one or more thermal conductivity features to thermally couple the first side of the first die to the first side of the thermal block. In embodiments, the thermal block may be similar to the dummy die 236 of FIGS. 2A-2B, dummy die 338 of FIGS. 3A-3B, or dummy dies 564, 566 of FIGS. 5A-5B. In embodiments, the thermal conductivity features in the dummy dies may include TSVs 236a of FIG. 2A, TSVs 339 of FIG. 3, or TSVs 564a of FIG. 5A-5B. In embodiments, the TSVs or other thermal conductivity features may also include at least silicon, copper, or some other metal alloy, ceramic, or other material to facilitate thermal energy routing through the TSV or other thermal conductivity feature.

In embodiments, the thermal block may be similar to thermal block 439 of FIGS. 4A-4B, or thermal block 570 of FIGS. 5A-5B. In these embodiments, the thermal block may be thermally coupled with a passive area of a first die which includes TSVs, for example, base die 426 and TSVs 426a of FIGS. 4A-4B, or base die 526 and TSVs 526a of FIGS. 5A-5B. In some embodiments, the passive area of the first die may be directly thermally coupled with a TIM, such as TIM 532 of FIG. 5A.

Figure 7:
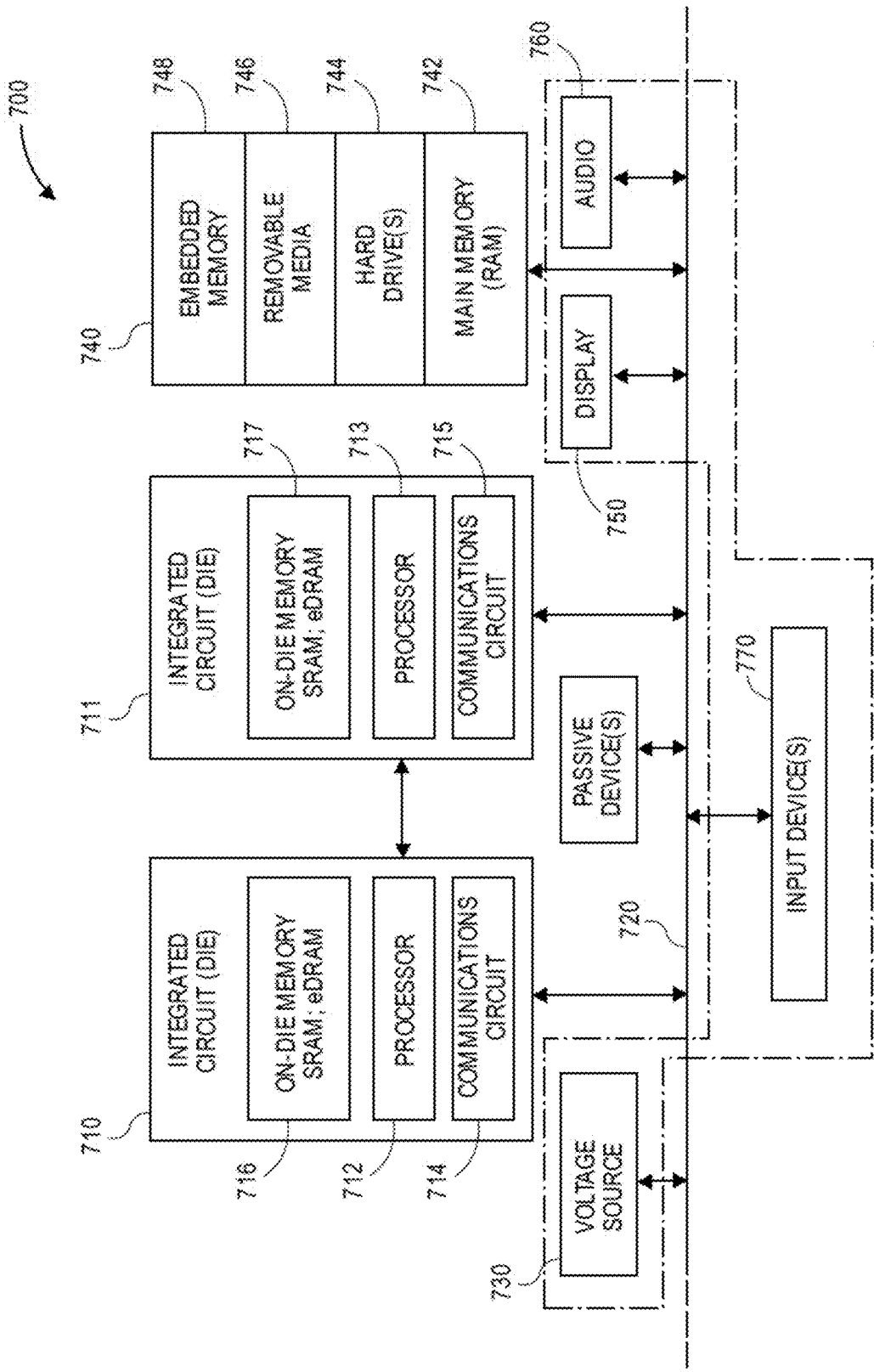
FIG. 7 schematically illustrates a computing device 700, in accordance with embodiments.

FIG. 7 schematically illustrates a computing device, in accordance with embodiments. The computer system 700 (also referred to as the electronic system 700) as depicted can embody enhanced base die heating paths using TSVs, according to any of the several disclosed embodiments and their equivalents as set forth in this disclosure. The computer system 700 may be a mobile device such as a netbook computer. The computer system 700 may be a mobile device such as a wireless smart phone. The computer system 700 may be a desktop computer. The computer system 700 may be a hand-held reader. The computer system 700 may be a server system. The computer system 700 may be a supercomputer or high-performance computing system.

In an embodiment, the electronic system 700 is a computer system that includes a system bus 720 to electrically couple the various components of the electronic system 700. The system bus 720 is a single bus or any combination of busses according to various embodiments. The electronic system 700 includes a voltage source 730 that provides power to the integrated circuit 710. In some embodiments, the voltage source 730 supplies current to the integrated circuit 710 through the system bus 720.

The integrated circuit 710 is electrically coupled to the system bus 720 and includes any circuit, or combination of circuits according to an embodiment. In an embodiment, the integrated circuit 710 includes a processor 712 that can be of any type. As used herein, the processor 712 may mean any type of circuit such as, but not limited to, a microprocessor, a microcontroller, a graphics processor, a digital signal processor, or another processor. In an embodiment, the processor 712 includes, or is coupled with, enhanced base die heating paths using TSVs, as disclosed herein. In an embodiment, SRAM embodiments are found in memory caches of the processor. Other types of circuits that can be included in the integrated circuit 710 are a custom circuit or an application-specific integrated circuit (ASIC), such as a communications circuit 714 for use in wireless devices such as cellular telephones, smart phones, pagers, portable computers, two-way radios, and similar electronic systems, or a communications circuit for servers. In an embodiment, the integrated circuit 710 includes on-die memory 716 such as static random-access memory (SRAM). In an embodiment, the integrated circuit 710 includes embedded on-die memory 716 such as embedded dynamic random-access memory (eDRAM).

In an embodiment, the integrated circuit 710 is complemented with a subsequent integrated circuit 711. Useful embodiments include a dual processor 713 and a dual communications circuit 715 and dual on-die memory 717 such as SRAM. In an embodiment, the dual integrated circuit 710 includes embedded on-die memory 717 such as eDRAM.

In an embodiment, the electronic system 700 also includes an external memory 740 that in turn may include one or more memory elements suitable to the particular application, such as a main memory 742 in the form of RAM, one or more hard drives 744, and/or one or more drives that handle removable media 746, such as diskettes, compact disks (CDs), digital variable disks (DVDs), flash memory drives, and other removable media known in the art. The external memory 740 may also be embedded memory 748 such as the first die in a die stack, according to an embodiment.

In an embodiment, the electronic system 700 also includes a display device 750, an audio output 760. In an embodiment, the electronic system 700 includes an input device such as a controller 770 that may be a keyboard, mouse, trackball, game controller, microphone, voice-recognition device, or any other input device that inputs information into the electronic system 700. In an embodiment, an input device 770 is a camera. In an embodiment, an input device 770 is a digital sound recorder. In an embodiment, an input device 770 is a camera and a digital sound recorder.

As shown herein, the integrated circuit 710 can be implemented in a number of different embodiments, including a package with enhanced base die heating paths using TSVs, according to any of the several disclosed embodiments and their equivalents, an electronic system, a computer system, one or more methods of fabricating an integrated circuit, and one or more methods of fabricating an electronic assembly that includes a package with enhanced base die heating paths using TSVs, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed packages with enhanced base die heating paths using TSVs embodiments and their equivalents. A foundation substrate may be included, as represented by the dashed line of FIG. 7. Passive devices may also be included, as is also depicted in FIG. 7.

EXAMPLES

Example 1 is a package comprising: a first die with a first side and a second side opposite the first side; a second die with a first side and a second side opposite the first side, wherein the first side of the first die is coupled with the second side of the second die; a thermal block with a first side and a second side opposite the first side, wherein the second side of the thermal block is thermally coupled with the first side of the first die; and wherein the thermal block is to thermally couple the first side of the first die to the first side of the thermal block.

Example 2 includes the package of example 1, wherein the thermal block includes one or more thermal conductivity features extending from the first side of the thermal block to the second side of the thermal block to thermally couple the first side of the thermal block with the second side of the thermal block.

Example 3 includes the package of example 2, wherein the one of the one or more thermal conductivity features include a selected one of copper, solder, tin, silver, or gold.

Example 4 includes the package of example 2, wherein the one or more thermal conductivity features at the second side of the thermal block are aligned, respectively, with one or more heat sources in the first die.

Example 5 includes the package of example 2, wherein the one or more thermal conductivity features are vias filled with thermally conductive material.

Example 6 includes the package of any one of examples 1-5, wherein the thermal block is a selected one of: a die, a dummy die, or a molding.

Example 7 includes the package of any one of examples 1-5, wherein the first die includes one or more thermal conductivity features extending to the first side of the first die and thermally coupling with the second side of the thermal block, wherein heat within the first die is to flow via the one or more thermal conductivity features to the thermal block.

Example 8 includes the package of example 7, wherein the one or more thermal conductivity features of the first die are within a silicon area of the first die.

Example 9 includes the package of any one of examples 1-5, wherein the thermal block is a first thermal block; and further comprising: a second thermal block with a first side and a second side opposite the first side, wherein the second side of the second thermal block is thermally coupled with the first side of the first die; and wherein the second thermal block is to thermally couple the first side of the first die to the first side of the second thermal block.

Example 10 includes the package of any one of examples 1-5, further comprising: a heat spreader thermally coupled with the first side of the thermal block.

Example 11 includes the package of example 10, further comprising a thermal interface material between the heat spreader and the first side of the thermal block to facilitate thermal conductivity between the heat spreader in the first side of the thermal block.

Example 12 is a method comprising: coupling a first side of a first die that has a second side opposite the first side with a second side of a second die that has a first side opposite the second side; coupling a thermal block to the first side of the first die, wherein the thermal block includes one or more thermal conductivity features to thermally couple the first side of the thermal block with the second side of the thermal block.

Example 13 includes the method of example 12, wherein the one or more thermal conductivity features include through silicon vias (TSVs).

Example 14 includes the method of example 13, wherein the one or more thermal conductivity features are vias filled with thermally conductive material.

Example 15 includes the method of any one of examples 12-14, wherein the thermally conductive material includes a selected one of copper, solder, tin, silver, or gold.

Example 16 is a system comprising: a substrate; a first side of a first die with the second side opposite the first side coupled to the substrate; a second die with a first side and a second side opposite the first side, wherein the first side of the first die is coupled with the second side of the second die; a thermal block with a first side and a second side opposite the first side, wherein the second side of the thermal block is thermally coupled with the first side of the first die; and wherein the thermal block is to thermally couple the first side of the first die to the first side of the thermal block.

Example 17 includes the system of example 16, further comprising a heat spreader thermally coupled with the first side of the thermal block and substantially surrounding the first die and the second die.

Example 18 includes the system of example 16, wherein the heat spreader is thermally coupled with the first side of the second die.

Example 19 includes the system of example 18, further comprising a thermal interface material between the heat spreader and the first side of the thermal block to facilitate thermal conductivity between the heat spreader in the first side of the thermal block.

Example 20 includes the system of any one of examples 16-19, wherein the thermal block is a first thermal block; and further comprising: a second thermal block with a first side and a second side opposite the first side, wherein the second side of the second thermal block is thermally coupled with the first side of the first die; and wherein the first side of the second thermal block is thermally coupled with the heat spreader.

The above paragraphs describe examples of various embodiments.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. A stacked die package, comprising:
   a substrate;
   a base die coupled to the substrate by solder;
   a top die vertically over the base die, the top die coupled to the base die with interconnects, the top die having a first sidewall and a second sidewall, the second sidewall laterally opposite the first sidewall;
   a first dummy die laterally spaced apart from the first sidewall of the top die, the first dummy die vertically over the base die, and the first dummy die comprising silicon;
   a second dummy die laterally spaced apart from the second sidewall of the top die, the second dummy die vertically over the base die, and the second dummy die comprising silicon; and
   a heat spreader vertically over the top die, over the first dummy die and over the second dummy die.

2. The stacked die package of claim 1, wherein the base die is a thermal energy generating die.

3. The stacked die package of claim 1, wherein the top die is a thermal energy generating die.

4. The stacked die package of claim 1, wherein the top die, the first dummy die and the second dummy die are within a footprint of the base die.

5. The stacked die package of claim 1, further comprising:
   a thermal interface material between the heat spreader and the top die.

6. The stacked die package of claim 1, wherein the heat spreader is further laterally spaced apart from a side of the first dummy die and laterally spaced apart from a side of the second dummy die.

7. The stacked die package of claim 1, wherein the first dummy die and the second dummy die include through silicon vias.

8. The stacked die package of claim 1, wherein the first dummy die and the second dummy die route thermal energy from the base die away from the top die.

9. A stacked die package, comprising:
   a substrate;
   a first thermal energy generating die coupled to the substrate by solder;
   a second thermal energy generating die vertically over the first thermal energy generating die, the second thermal energy generating die coupled to the first thermal energy generating die with interconnects, the second thermal energy generating die having a first sidewall and a second sidewall, the second sidewall laterally opposite the first sidewall;

a first die laterally spaced apart from the first sidewall of the second thermal energy generating die, the first die vertically over the first thermal energy generating die, and the first die comprising silicon;

a second die laterally spaced apart from the second sidewall of the second thermal energy generating die, the second die vertically over the first thermal energy generating die, and the second die comprising silicon; and a heat spreader vertically over the second thermal energy generating die, over the first die and over the second die.

10. The stacked die package of claim 9, wherein the second thermal energy generating die, the first die and the second die are within a footprint of the first thermal energy generating die.

11. The stacked die package of claim 9, wherein the heat spreader is further laterally spaced apart from a side of the first die and laterally spaced apart from a side of the second die, the stacked die package of claim 1, further comprising:
a thermal interface material between the heat spreader and the second thermal energy generating die.

12. The stacked die package of claim 9, wherein the first die and the second die include through silicon vias, and wherein the first die and the second die route thermal energy from the first thermal energy generating die away from the second thermal energy generating die.

13. A method of fabricating a stacked die package, the method comprising:

coupling a base die coupled to a substrate by solder;

coupling a top die to the base die with interconnects, the top die vertically over the base die, the top die having a first sidewall and a second sidewall, the second sidewall laterally opposite the first sidewall;

providing a first dummy die laterally spaced apart from the first sidewall of the top die, the first dummy die vertically over the base die, and the first dummy die comprising silicon;

providing a second dummy die laterally spaced apart from the second sidewall of the top die, the second dummy die vertically over the base die, and the second dummy die comprising silicon; and forming a heat spreader vertically over the top die, over the first dummy die and over the second dummy die.

14. The method of claim 13, wherein the base die is a thermal energy generating die.

15. The method of claim 13, wherein the top die is a thermal energy generating die.

16. The method of claim 13, wherein the top die, the first dummy die and the second dummy die are with a footprint of the base die.

17. The method of claim 13, further comprising:
forming a thermal interface material between the heat spreader and the top die.

18. The method of claim 13, wherein the heat spreader is further along a side of the first dummy die and along a side of the second dummy die.

19. The method of claim 13, wherein the first dummy die and the second dummy die include through silicon vias.

20. The method of claim 13, wherein the first dummy die and the second dummy die route thermal energy from the base die away from the top die.

* * * * *